(12) United States Patent
Rodrigues de Lima et al.

(10) Patent No.: US 11,736,248 B2
(45) Date of Patent: Aug. 22, 2023

(54) LONG-RANGE DIGITAL RADIO

(71) Applicant: Instituto de Pesquisas Eldorado, Campinas (BR)

(72) Inventors: Eduardo Rodrigues de Lima, Campinas (BR); Denise Alves Tamagno, Solna (SE); Gabriel Santos da Silva, Solna (SE); Daniel Garcia Urdaneta, Campinas (BR)

(73) Assignee: Instituto de Pesquisas Eldorado, Campinas (BR)

( * ) Notice: Subject to any disclaimer, the term of this patent is extended or adjusted under 35 U.S.C. 154(b) by 0 days.

(21) Appl. No.: 17/730,251

(22) Filed: Apr. 27, 2022

(65) Prior Publication Data
US 2022/0376853 A1 Nov. 24, 2022

Related U.S. Application Data

(60) Provisional application No. 63/180,757, filed on Apr. 28, 2021.

(51) Int. Cl.
*H04L 5/00* (2006.01)
*H03M 13/11* (2006.01)
*H04W 72/51* (2023.01)

(52) U.S. Cl.
CPC ....... *H04L 5/0044* (2013.01); *H03M 13/1102* (2013.01); *H04L 5/0007* (2013.01); *H04W 72/51* (2023.01)

(58) Field of Classification Search
CPC ..... H04L 5/0044; H04L 27/36; H04L 5/0007; H04W 72/51; H03M 13/1102;
(Continued)

(56) References Cited

U.S. PATENT DOCUMENTS 11,539,424 B2 * 12/2022 Tang ...................... H04B 7/086
2005/0233710 A1 * 10/2005 Lakkis ............... H04B 1/71637
455/102

(Continued)

OTHER PUBLICATIONS

"IEEE Standard for Local and metropolitan area networks—Part 15.4: Low-Rate Wireless Personal Area Networks (LR-WPANs), Amendment 3: Physical Layer (PHY) Specifications for Low Data-Rate, Wireless, Smart Metering Utility Networks", IEEE, New York, Apr. 27, 2012.

(Continued)

*Primary Examiner* — Khanh C Tran
(74) *Attorney, Agent, or Firm* — André Grouwstra

(57) ABSTRACT

A digital radio OFDM modulator and demodulator provide an efficient mode and a backwards-compatible mode to work with IEEE 802.15.4g or a similar standard. In backwards-compatible mode, they use a single method for error encoding physical header and payload transmit data, and a single method for detecting and correcting errors in physical header and payload receive data. In efficient mode, they use two different methods. The payload is BCH-LDPC encoded. They may also use mapping constellations that are not available in IEEE 802.15.4g, including 64-QAM, 256-QAM, and APSK. To ensure that physical header data can be received more robustly than payload data, they use frequency diversity of the physical header data, and selection maximal ratio combining (SMRC) in the demodulator to reduce the bit error rate (BER) at a low cost.

11 Claims, 8 Drawing Sheets

(58) Field of Classification Search
CPC ........... H03M 13/152; H03M 13/2906; H03M 13/23; H03M 13/27; H03M 13/6362
See application file for complete search history.

(56) References Cited

U.S. PATENT DOCUMENTS

| | | | | |
|---|---|---|---|---|
| 2006/0062315 A1* | 3/2006 | Luz | ........................ | H04K 1/006 375/260 |
| 2012/0002564 A1* | 1/2012 | Sexton | .................... | H03M 7/30 370/255 |
| 2013/0290815 A1* | 10/2013 | Kim | ..................... | H04L 1/0085 714/776 |
| 2015/0049837 A1* | 2/2015 | Baek | ................... | H04N 21/236 375/295 |

OTHER PUBLICATIONS

"A pipelined semi-parallel LDPC Decoder architecture for DVB-S2", Denise Alves, Eduardo Rodrigues de Lima, Jose E. Bertuzzo, 3rd Workshop on Circuits and Systems Design (WCAS 2013), Curitiba—PR—Brazil, Sep. 2013.

"Using Diversity Combining Techniques and Extended Spreading Factors to Improve Performance and Reduce OFDM Receiver Complexity in IEEE 802.15.4g", Gabriel Santos da Silva, Master's thesis, Universidade Estadual de Campinas, 2017.

"Optimized Min-Sum Decoding Algorithm for Low Density Parity Check Codes", Mohammad Rakibul Islam, Dewan Siam Shafiullah, Muhammad Mostafa Amir Faisal, Imran Rahman, (IJACSA) International Journal of Advanced Computer Science and Applications, vol. 2, No. 12, 2011.

* cited by examiner

| SHR | | PHR | Payload | | |
|---|---|---|---|---|---|
| STF | LTF | Config | PSDU | TAIL | PAD |
| No coding | | One forward error encoding system | | | |
FIG. 3 (Prior Art)
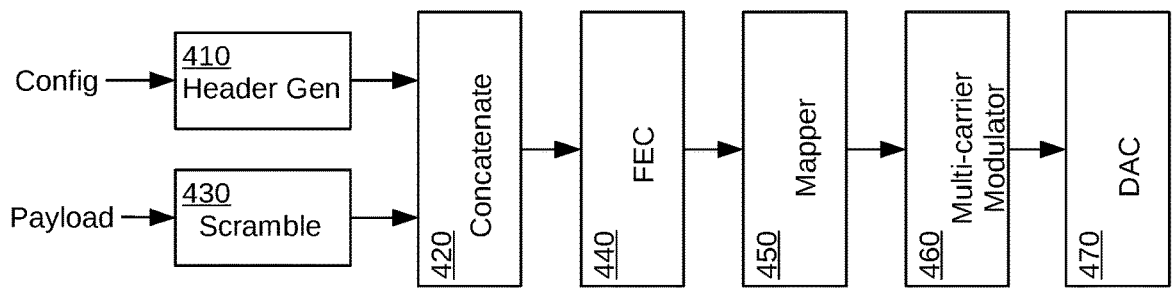
FIG. 4 (Prior Art)
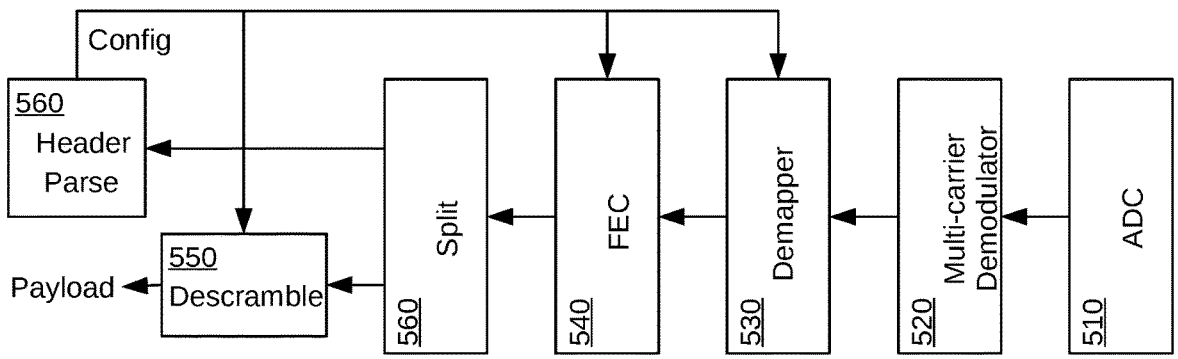
FIG. 5 (Prior Art)

600

| SHR | | PHR | Payload | | |
|---|---|---|---|---|---|
| STF | LTF | Config | PSDU | TAIL | PAD |
| No coding | | 1st code | Second FEC encoding | | |

| MCS | Code Id | Repeat | Mod | kb/s | LLR bits | Iter | Offset | Norm | Paths |
|---|---|---|---|---|---|---|---|---|---|
| | E/D | E/D | E/D | E/D | D | D | D | D | D |
| 0-6 | backward-compatible modes | | | | n/a | n/a | n/a | n/a | n/a |
| 10 | 1/2 | 2x | QPSK | 800 | 3-8 | 1-50 | | 1-6 | 240-480 |

E/D = used in encoding and decoding
D   = used in decoding only

FIG. 7

LONG-RANGE DIGITAL RADIO

REFERENCES

This application claims priority from U.S. provisional patent application Ser. No. 63/180,757, entitled "Long-Range Digital Radio", filed on 28 Apr. 2021, which is hereby incorporated by reference as if set forth in full in this application for all purposes.

BACKGROUND

The present invention is in the field of digital radio. More particularly, it addresses long-range communication in point-to-point, point-to-multipoint, and mesh network applications.

Digital radio architectures vary, based on compromises an application allows, such as between use of power, data rates, robustness of the transmitted data against various adverse channel conditions, and other factors. New applications for wireless data transfers may use existing architectures, or may require innovation to achieve previously unfeasible performance. In many situations, legal requirements may limit the power used for data communication, for example to a power of 1 Watt.

Wi-SUN, specified in IEEE 802.15.4g, is a digital radio standard for long-range communication in point-to-point, point-to-multipoint, and mesh network applications. It offers a data rate of up to 300 kilobits per second over a point-to-point range of 4 km, based on power output at the antenna of 1 W. It supports networks of up to 5,000 devices. It can be used, for example, for communication with smart meters, intelligent streetlights, or Internet-of-Things (IoT) devices in a neighborhood or campus. In recent years, the standard has added orthogonal frequency-division multiplexing (OFDM) as a transmission method, increasing its data rates and/or signal robustness. However, for communication between distant locations, such as cities that may be 50 kilometers apart, the data rates would have to be severely limited to work with an antenna power of 1 W.

A wireless digital radio system 100 may, in general, look like FIG. 1, which illustrates a transmitter 110 in a first location, and a receiver 120 in a second location. Transmitter 110 includes a data source 112, which may, for example, include a sensor and an analog-to-digital converter; a modulator 114 that converts the digital data from the data source 113 to a signal that may be transmitted 115; a first RF stage 116 (RF=radio frequency); and an antenna 118. First RF stage 116 may include a local oscillator, a mixer, and/or a power amplifier. Receiver 120 includes an antenna 122; a second RF stage 124 that may include a low-noise amplifier (LNA), a local oscillator, a mixer and/or a filter; a demodulator 126 to convert a received antenna signal 123 to received digital data 125 that closely resembles the transmitter's digital data from the data source 113; and an output 128 to present or forward the received digital data 125 to a user. The wireless digital radio system 100 is suitable for one-way communication via communication channel 130.

FIG. 2 illustrates a wireless digital radio system 200 that is capable of two-way communication between a first location and a second location. A first transceiver 210 includes a first data source 212 connected with a first modem 214 that converts first transmit data 213 to first transmit signal 215. A first RF stage 216 converts and amplifies the first transmit signal 215 and forwards it to the first antenna 218 for transmission via communication channel 240. First transceiver 210 also picks up first receive signal 219 from first antenna 218, forwards it to first modem 214 for conversion to first receive data 221, which is presented to a first user via first data output 222. Dependent on the application, the first user may be an apparatus or a living being.

A second transceiver 250 includes a second antenna 258 that picks up a second receive signal 259, a second modem 254 that converts second receive signal 259 to second receive data 261, and a second data output 262 to present second receive data 261 to a second user. Again, dependent on the application, the second user may be an apparatus or a living being. Second transceiver 250 further includes second data source 252 connected with second modem 254, which converts second transmit data 253 to second transmit signal 255. A second RF stage 256 converts and amplifies second transmit signal 255 and forwards it to second antenna 258 for transmission via communication channel 240. Although FIG. 2 presents first RF stage 216 and second RF stage 256 as bidirectional stages, a person with ordinary skills in the art knows that in reality these blocks include transmit and receive paths that are carefully separated to prevent interference from the powerful transmit signal to the sensitive receive signal. However, for the present invention the separation is not relevant.

If wireless digital radio system 200 operates well, then second receive data 261 closely resembles first transmit data 213, and first receive data 221 closely resembles second transmit data 253. However, if communication channel 240 adds too much noise, echoes, or other interference, or if communication channel 240 is temporarily unavailable, first receive data 221 and second receive data 261 may contain errors and/or gaps in their data. The bit error rate (BER) is an important metric for the quality of operation. A high BER may be countered by (i) increasing the transmit power; (ii) reducing the distance between the first location and the second location; (iii) reducing the payload data rate and increasing the rate of data used for error protection in forward error correction (FEC) circuits; (iv) increasing the gain of first antenna 218 and/or second antenna 258; (v) modifying communication channel 240 by modifying the antenna positions; and/or (vi) several other analog and digital techniques to improve the performance of first transceiver 210 and second transceiver 250.

Many such techniques are known in the art, and have been documented for over more than a century. Some of those techniques are only suitable for use in systems with one-way communication as illustrated in FIG. 1, and other techniques are suitable for use in systems with either one-way communication as illustrated in FIG. 1 or two-way communication as illustrated in FIG. 2. Some of these techniques require changes in circuits, but not in architecture; others require architectural changes. Embodiments of the invention provide an extension to and improvement over Wi-SUN with OFDM, and similar communications systems, increasing the available range and/or data rate.

SUMMARY

Digital radio architectures vary, based on an application's requirements related to data bandwidth, power use, range of transmission, and bit-error-ratio of the received signal. New applications for wireless data transfers may use existing architectures, or may require innovation to achieve previously unfeasible performance. In many situations, legal requirements may limit the power used for data communication, for example to a power of 1 Watt. This means that for communication between distant locations, such as cities that may be 50 kilometers apart, the data rates may be severely limited. Embodiments of the invention employ novel architectures for and backward-compatible methods of modulating and demodulating data, which result in higher data rates and/or longer ranges without the need to increase the power or reduce the communication's robustness. Alternatively, a designer may choose to keep the range the same and improve any of the other performance factors. Techniques described herein may be viewed as extensions of and improvements over existing wireless communication systems, such as described in the IEEE standard 802.15.4g which is focused on low-date-rate networks.

Embodiments of the invention provide modes that are backward compatible with IEEE 802.15.4g, but also an "efficient" mode that provides for higher data rate, longer range, lower power, and/or lower bit-error rate (BER) of the transmission. In the efficient mode, an embodiment improves on the IEEE 802.15.4g standard by employing more advanced error coding and modulation for payload data. However, a simple substitution of the error coding and/or modulation blocks to obtain the superior functionality does not work, as it would break the rule that configuration data must be transmitted with the highest robustness. Embodiments solve this problem by applying additional frequency diversity for the physical header that contains the configuration information, and by applying a new method to use the frequency diversity to obtain sufficient robustness of the received physical header data.

In a first aspect, a digital radio modulator comprises a physical header generator, a first forward error encoder, a second forward error encoder, a mapper, a frequency spreader, and a multi-carrier modulator. The physical header includes configuration information. The first forward error encoder encodes the physical header. The second forward error encoder encodes payload data. The second forward error encoder uses a different forward error encoding method than the first forward error encoder, resulting in a higher coding efficiency and a higher bit-error-ratio per transmitted bit. The mapper maps the error encoded data from the first and second forward error encoders to a first series of constellation points. The frequency spreader creates multiple copies of at least a part of the first series of constellation points to provide frequency diversity. The first series of constellation points together with the copies constitute a second series of constellation points that is larger than the first series of constellation points. The multi-carrier modulator modulates multiple subcarriers with the second series of constellation points to allow a remote receiver to receive the encoded physical header data with a higher signal-to-noise ratio than the encoded payload data. In some embodiments, the modulation method is orthogonal frequency-division multiplexing (OFDM). The first forward error encoder may use convolutional encoding. The second forward error encoder may use Bose-Chaudhuri-Hocquenghem (BCH) coding and low-density parity-check (LDPC) coding. The second forward error encoder uses an effective code rate of 4 over 9.

In a second aspect, an embodiment provides a digital radio demodulator that comprises a multi-carrier demodulator, a frequency despreader, a soft demapper, a first forward error decoder, a second forward error decoder, and a physical header parser. The multicarrier demodulator receives a symbol that includes a series of N subcarriers each modulated with a constellation point that represents one of M discrete data values. The multicarrier demodulator demodulates the subcarriers to output a series of N constellation points. The N constellation points constitute a first series of constellation points. The frequency despreader selects and combines parts of the first series of constellation points to a second series of constellation points, smaller than the first series, with increased average signal-to-noise ratio. The demapper receives the second series of constellation points from the frequency despreader and converts each single constellation point to one or more data bits representing a log-likelihood ratio (LLR) associated with one of the M discrete data values and characterizing its robustness. For example, a data value that was received with a poor signal-to-noise ratio will have a low robustness, whereas another data value received with a good signal-to-noise ratio will have a high robustness. A series of data bits output by the demapper may represent error-coded data (first encoded data, or second encoded data). The first forward error decoder detects and corrects errors in the first encoded data to obtain first error-corrected data. The second forward error decoder detects and corrects errors in the second encoded data to obtain second error-corrected data. The physical header parser parses the first error-corrected data to find configuration data, including a mode (the mode is either backward compatible or high efficiency). In backward-compatible mode, the embodiment outputs a part of the first error-corrected data as payload data. In high-efficiency mode, the embodiment outputs the second error-corrected data as payload data. The second forward error decoder includes a Bose-Chaudhuri-Hocquenghem (BCH) decoder and a low-density parity coding (LDPC) decoder executing a minimum-sum LDPC algorithm that uses an effective code rate of 4 over 9, a normalization factor between 1 and 6 inclusive, and up to 50 iterations.

In a third aspect, an embodiment provides a method for demodulating digital data. The method comprises: demodulating a set of modulated carriers into a symbol that includes a first series of constellation points associated with the modulated carriers; using frequency diversity to improve a signal-to-noise ratio of at least a part of the first series of constellation points, obtaining a second series of constellation points that is smaller than the first series; demapping the second series of constellation points into error-coded PHR data based on a first mapping configuration, and error-coded payload data based on a second mapping configuration; performing error detection and correction on the error-coded PHR data using a first error detection and correction algorithm, where parameters for the first error detection and correction algorithm are available parameters that provide most robustness against transmission errors; parsing the error-corrected PHR data to obtain configuration information; determining from the configuration information if a mode is "efficient" by determining if the configuration information includes a configuration option that is only available in "efficient" mode;

upon determining that the mode is "efficient", obtaining a second mapping configuration and second error-detection and correction parameters from the configuration information, wherein the second mapping configuration includes an effective code rate of 4 over 9, and wherein the second error-detection and correction parameters include a normalization factor between 1 and 6 inclusive, and a number of iterations up to 50;

upon determining that the mode is "efficient", using the second mapping configuration for demapping a second part of the second series of constellation points into error-encoded payload data, and to calculate bits carrying a log-likelihood ratio (LLR) characterizing robustness of the error-encoded payload data, wherein the number of LLR bits is between 3 and 8, inclusive;

upon determining that the mode is "efficient", performing error detection and correction on the error-encoded payload data to obtain error-corrected payload data, using a second error detection and correction algorithm that includes a minimum-sum low-density parity code (LDPC) algorithm, using at least a part of the second error-detection and correction parameters; upon determining that the mode is not "efficient", performing error detection and correction on the error-coded payload data using the first error detection and correction algorithm, where parameters for the first error detection and correction algorithm are based on the configuration information and in ranges as provided by FIG. 7; and outputting the error-corrected payload data and/or forwarding the error-corrected payload data to a media access control (MAC) decoder.

The method may further comprise receiving a series of constellation points with M copies of at least part of a data item and estimating a signal-to-noise ratio (SNR) of each constellation point. The method selects, for each M constellation points that relate to a bit of the data item, L constellation points with the highest estimated SNR, wherein L is lower than or equal to M. For each bit of the data item, it determines an amplitude and phase of each of the L selected constellation points, corrects the amplitude and phase of each of the L selected constellation points, and sums the corrected constellation points to obtain a constellation point with improved signal-to-noise ratio.

A further understanding of the nature and the advantages of particular embodiments disclosed herein may be realized by reference of the remaining portions of the specification and the attached drawings.

BRIEF DESCRIPTION OF THE DRAWINGS

The invention will be described with reference to the drawings, in which:

FIG. 3 illustrates an example of a conventional data packet;

FIG. 4 illustrates a conventional digital radio modulator;

FIG. 5 illustrates a conventional digital radio demodulator;

FIG. 6 illustrates an example data packet according to an embodiment of the invention;

FIG. 7 illustrates parameter settings for modulation and error coding according to an embodiment of the invention;

Figure 1:
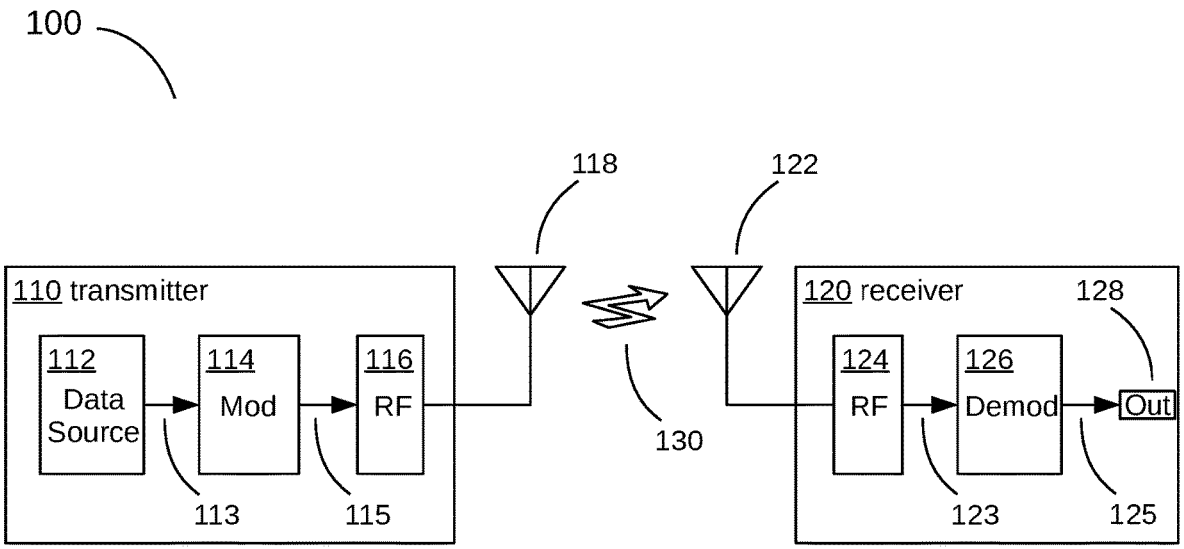
FIG. 1 illustrates a wireless digital radio system suitable for one-way communication.
Figure 2:
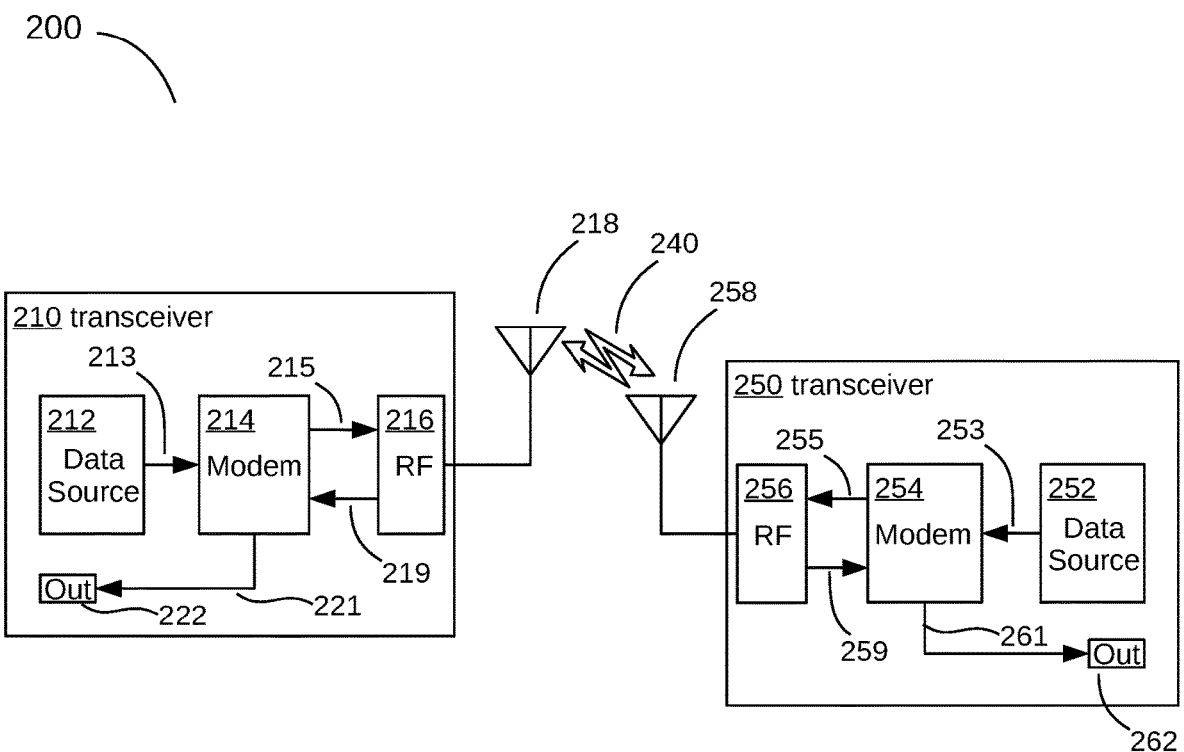
FIG. 2 illustrates a wireless digital radio system suitable for two-way communication.

In the figures, like reference numbers may indicate functionally similar elements. The systems and methods illustrated in the figures, and described in the Detailed Description below, may be arranged and designed in a wide variety of different embodiments. Neither the figures, nor the Detailed Description, are intended to limit the scope as claimed. Instead, they merely represent examples of different embodiments of the invention.

DETAILED DESCRIPTION

Digital radio architectures vary, based on compromises an application allows such as between use of power, data rates, robustness of the transmitted data against various channel conditions, and other factors. New applications for wireless data transfers may use existing architectures, or may require innovation to achieve previously unfeasible performance. In many situations, legal requirements may limit the power that may be used for data communication, for example to a power of 1 Watt. This means that for communication between distant locations, such as cities that are 50 kilometers apart, the data rates have to be severely limited. Embodiments of the invention employ novel architectures for and backward-compatible methods of modulating and demodulating data, which result in higher data rates with the available power, a larger communication distance, or enhanced communication robustness. Techniques described herein may be viewed as extensions of and improvements over existing wireless communication systems, such as described in the IEEE standard 802.15.4g which is focused on low-date-rate networks.

FIG. 3 illustrates an example of a conventional data packet 300. Data packet 300 includes four separate parts: a synchronization header (SHR); a physical header (PHR); a payload; and tail data/padding bits. This type of data packet is found in, for example, the IEEE 802.15.4g standard. The SHR is used to help a receiver synchronize to the transmitter's frequency and timing. The PHR includes configuration data for the demodulator. The payload includes actual data to be transmitted (the PSDU—physical service data unit) and, when necessary, it may be followed by a tail and padding bits. The tail may include zeros to reset decoders (for example 6 zero-bits to allow for a convolutional coder's look ahead beyond the end of the data). The padding bits (usually zeros) are added when insufficient data is present to entirely fill the data packet.

The synchronization header SHR may include a short training field (STF) and a long training field (LTF). The physical header PHR may include configuration information such as the modulation and (forward error) coding system (MCS) used for the payload, the payload frame length, scrambler configuration and/or seed, a header check sequence (HCS), a number of tail bits that could flush a Viterbi or other error decoder, and other parts. Some parts of data packet 300 may have a fixed length, other parts may have a variable length. Generally, data packet 300 is transmitted in chunks called symbols, where each successive symbol can carry a fixed number of bits. A symbol, when transmitted, may also include pilot tones, static and guard tones, and a cyclic prefix to protect against multipath fading. The SHR is not forward-error-encoded. In a conventional data packet, all parts following the SHR use the same system of forward error coding to protect data from errors. Generally, the physical header data needs to be at least as robust as or more robust than the payload data, since an error in the configuration data may result in the loss of part or all of the payload. For the PHR to be more robust than the payload, its BER needs to be lower than that of the payload for the same signal-to-noise ratio (SNR) or, conversely, the same BER must be achieved at a worse (lower) SNR. To achieve this, a conventional data packet encodes and modulates the PHR with the lowest (most robust) of a series of options for the MCS, whereas the payload may be encoded and modulated with a higher (less robust but more efficient) option. The type of forward error coding in a conventional data packet is typically convolutional encoding, which works well with the short length of the PHR.

FIG. 4 illustrates a conventional digital radio modulator 400. Digital radio modulator 400 includes header generator 410, which encapsulates configuration information in a PHR data structure. Digital radio modulator 400 forwards its payload to a scrambler 430 that takes the data and scrambles it to disperse its energy, for example to ensure that its energy is uniformly spread over a data frequency band. The header generator 410 and the scrambler 430 forward their output signals to concatenator 420, which is essentially a multiplexer that determines when the PHR or the payload is forwarded to the next several blocks. The selected information is supplemented with redundant data by FEC encoder 440 (FEC=forward error coder), which may handle functions including error encoding, puncturing, and interleaving. FEC encoder 440 presents the encoded data to mapper 450 which takes bits from the data and maps these bits to constellation points of a modulation constellation (such as M-PSK, QAM, APSK, etc.).

In the context of this patent document, a constellation point is defined as a member of a discrete set of points in a constellation diagram, wherein the constellation diagram defines the M possible values of the phase shift and amplitude that a digitally modulated signal can have to represent M possible values of a set of one or more bits. For example, a set of 3 bits represents 8 different values, and therefore requires a constellation diagram with M=8 different constellation points. In this context, the digitally modulated signal uses a single carrier or a single subcarrier. In a single-carrier modulation system, the constellation diagram defines a set of M symbols. Thus, each constellation point represents a symbol from the set of M possible symbols. However, in a multi-carrier modulation system, each of N data subcarriers can have M possible values as each of the subcarriers can be modulated with one of M different constellation points. Therefore, a multi-carrier modulation system can modulate N×M different symbols.

Mapper 450 (or a separate frequency spreader) may create multiple mappings of the data bits to provide for frequency spreading to make communication less vulnerable to disturbances in the frequency domain (such as interference from fixed-frequency sources). The constellation points determine the modulation of multiple simultaneous subcarriers. A framer (not drawn) may add information for subcarriers that do not carry data, such as zero carriers and pilot carriers. The full set of subcarrier data is modulated and converted to the time domain by modulator 460, and the modulated signal is converted from the digital domain to the analog domain by DAC 470 (DAC=digital-to-analog converter). Modulator 460 may use an inverse fast Fourier transform (IFFT), an inverse discrete cosine transform (IDCT), or yet another transformation to perform the modulation and conversion from the frequency domain to the time domain, and it may prepend the data with a cyclic rotated copy of the data to act as a guard interval that reduces intersymbol interference. Modulator 460 may use Orthogonal Frequency-Division Multiplexing (OFDM) as a system for efficiently using multiple subcarriers, resulting in the most efficient use of the radio spectrum. Digital radio modulator 400 may further include a time interleaver to scramble data in time and thus make communication less vulnerable to disturbances in the time domain (such as a burst of noise caused by lightning). Many algorithms or techniques exist for each of the blocks in digital radio modulator 400 to optimize communication for one algorithm or technique, or another.

FIG. 5 illustrates a conventional digital radio demodulator 500. In this figure, data moves from the right to the left. An ADC 510 (ADC=analog-to-digital converter) receives analog data from a radio-frequency signal or intermediate-frequency signal (not drawn) and converts this analog data to a digital signal, which it forwards to demodulator 520. Demodulator 520 may demodulate the information from multiple subcarriers, and forward a resulting constellation point for each of the multiple subcarriers to demapper 530. For example, it may calculate a fast Fourier transformation (FFT), a discrete cosine transformation (DCT), or yet another transformation of a series of samples from ADC 510 to determine the constellation points of the multiple subcarriers. Demodulator 520 may employ OFDM demodulation of the multiple carriers. Demapper 530 maps each constellation point back to data bits, consistent with and opposite to the mapping process of mapper 450 in FIG. 4. Demapper 530 may further handle despreading or be preceded by a separate frequency despreader. In some digital radio demodulators, demapper 530 may be a soft demapper that may calculate some bits to characterize the robustness of a received signal, for example in the form of a log-likelihoods ratio (LLR). This information is used by some error decoders. The data bits found by demapper 530 may contain errors, because of disturbances and fading in communication channel 130 or communication channel 240; errors and noise in second RF stage 124, first RF stage 216, or second RF stage 256; misalignment between the modulation process in digital radio modulator 400 and the demodulation process in digital radio demodulator 500; and other error sources. However, FEC encoder 440 (in FIG. 4) has added redundant information to the signal to enable detecting and correcting errors, and FEC decoder 540 uses this redundant information for exactly this purpose. FEC decoder 540 thus outputs corrected information that should be identical to or at least very similar to the input information received by FEC encoder 440. FEC decoder 540 may handle functions that include deinterleaving, de-puncturing, and error detection and correction. A splitter 560 separates the physical header (PHR) and payload information, and the configuration information in the PHR is used to provide the settings for the payload demodulation and error-correction process. Lastly, descrambler 550 descrambles the payload information forwarded by splitter 560 to undo the energy dispersion from scrambler 430. The configuration information cannot be used for finding the configuration information itself, unless digital radio demodulator 500 uses a blind technique. Normally, the PHR is modulated and demodulated with the simplest option of a series of MCS alternatives, such that the PHR is always transmitted and received with the highest robustness against noise and interference. Since the PHR precedes the payload (see FIG. 3), its configuration information can be used for demodulation, error correction and descrambling of the payload information.

In a conventional digital radio system, the PHR and the payload data are encoded using the same forward error correction encoding algorithm as shown in FIG. 3, although settings for this algorithm may be different for the payload than for the PHR. For example, in IEEE 802.15.4g, both the PHR and the payload are coded with convolutional coding, and decoded with a Viterbi decoder. However, convolutional coding/Viterbi decoding poses a limitation in long-range radio connections with limited transmission power. When transmission power is limited, the radio channel's noise will quickly become dominant with increased distance, and the rate of received bits that are corrupted by the transmission channel will exceed the error-correcting capabilities of the Viterbi decoder. It has been known in the art for a few decades that low-density parity-check (LDPC) combined with Bose-Chaudhuri-Hocquenghem (BCH) coding has a much higher error-correcting capability than convolutional coding/Viterbi decoding. However, to reach sufficiently efficient use of the channel capacity, LDPC coding requires large block lengths (the block length is the number of bits in a series of data bits plus the number of parity bits). The payload can easily satisfy this requirement, but the requirement poses a problem for the relatively short PHR, which must be coded separately. Embodiments of the invention achieve a better communication range with the same transmission power (or a lower transmission power with the same communication range) by using BCH and LDPC coding for the payload, and convolutional coding for the PHR. The robustness of the PHR coding must be higher than that of the payload coding (since the PHR contains the configuration for the payload demodulation), and this is achieved by using convolutional coding enhanced with frequency diversity for the PHR bits. The LDPC decoding must be performed by an algorithm that can be implemented at sufficiently low cost. The LDPC may use soft demapping information. That is, instead of the demapper making a final decision whether a received bit is a "0" or a "1", the demapper provides a number of bits to represent the likelihood (e.g., in the form of the log-likelihood ratio (LLR)) that a received bit represents a 0 or a 1. Embodiments of the invention use a minimum-sum algorithm in the LDPC to achieve a low cost. The minimum-sum algorithm is configured through several parameters, including the number of LLR bits; the number of paths that are searched separately; the number of iterations; the offset; and a normalization factor. These parameters are well-known in the art, and details are discussed in, for example, "A pipelined semi-parallel LDPC Decoder architecture for DVB-S2" by Alves, Lima, and Bertuzzo, a conference paper of the 3$^{rd}$ Workshop on Circuits and Systems Design (WCAS 2013) at Curitiba—PR, Brazil, published at https://www.researchgate.net. Embodiments use a choice of these parameters that the inventors found through significant testing using channel and noise simulations that realistically represent conditions in extended range transmissions, using code rates and OFDM options in a transmission format that preserves backward compatibility with IEEE 802.15.4g.

Embodiments of the invention may use (1) a simple backward-compatible modulation and coding scheme (MCS) for the PHR, for example as required by IEEE 802.15.4g; (2) BCH-LDPC coding for the payload; (3) a broad selection of modulation types, including BPSK and higher modulations such as QPSK, QAM and APSK; (4) frequency diversity, beyond what is required by IEEE 802.15.4g, and new techniques (such as the technique described with reference to FIG. 14) to take advantage of the frequency diversity; and (5) LDPC parameter settings that are optimized for the architecture and applicable MCS and code rates (see also FIG. 7).

FIG. 6 illustrates an example data packet 600 according to an embodiment of the invention. Compared to the conventional data packet in FIG. 3, data packet 600 uses two different error coding schemes: a first FEC encoding (such as convolutional code) for the PHR, and a second FEC encoding (such as BCH-LDPC) for the payload. Some embodiments may be backwards compatible with IEEE 802.15.4g by using the same SHR and PHR structure. However, the PHR needs to allow room for using an MCS beyond the options provided by IEEE 802.15.4g or similar standard. Those embodiments can do so without having to use reserved bits (such as bits 5, 17-18, or 21) in the PHR. Rather, the standard offers 5 "Rate" bits $RA_4$-$RA_0$ to identify only 7 defined modulation and coding schemes MCS0-MCS6. The 5 Rate bits offer room for 32 modulation and coding schemes; therefore, an embodiment can define up to 25 additional coding schemes. As an example, an embodiment may define MCS8-MCS13, mirroring the modulation type and frequency diversity options of one or more of the existing MCS0-MCS6, but using the second FEC encoding (e.g., BCH-LDPC) instead of convolutional coding. Yet other embodiments may define additional coding schemes that don't mirror any existing MCS0-MCS6 scheme, but that offer different modulation types and/or frequency diversity.

FIG. 7 illustrates a table 700 with MCS parameters according to an embodiment of the invention. The table is similar to table 148 (data rates for MR-OFDM PHY) in the IEEE 802.15.4g standard. The first column lists the MCS, of which the first seven (MCS0-MCS6) are reserved for backward compatibility with the IEEE 802.15.4g standard. MCS10 is similar to MCS3 in using a code identifier of ½ (resulting in an effective LDPC rate of 4/9), QPSK modulation, but which has no frequency repetition. For OFDM option 1 it achieves a bit rate of 800 kbps. Due to the better error correction capability of BCH-LDPC, it tolerates noise better, and offers an increased bit-error rate (BER) at the same distance, or the same BER at an increased distance. Table 700 lists parameters showing optimal performance with 3 to 8 LLR bits, 1 to 50 iterations, a normalization factor between 1 and 6, and between 240 and 480 parallel paths. For example, an embodiment could use 5 LLR bits, 31 iterations, a normalization factor of 2 or 4, and 360 parallel paths.

Figure 8:
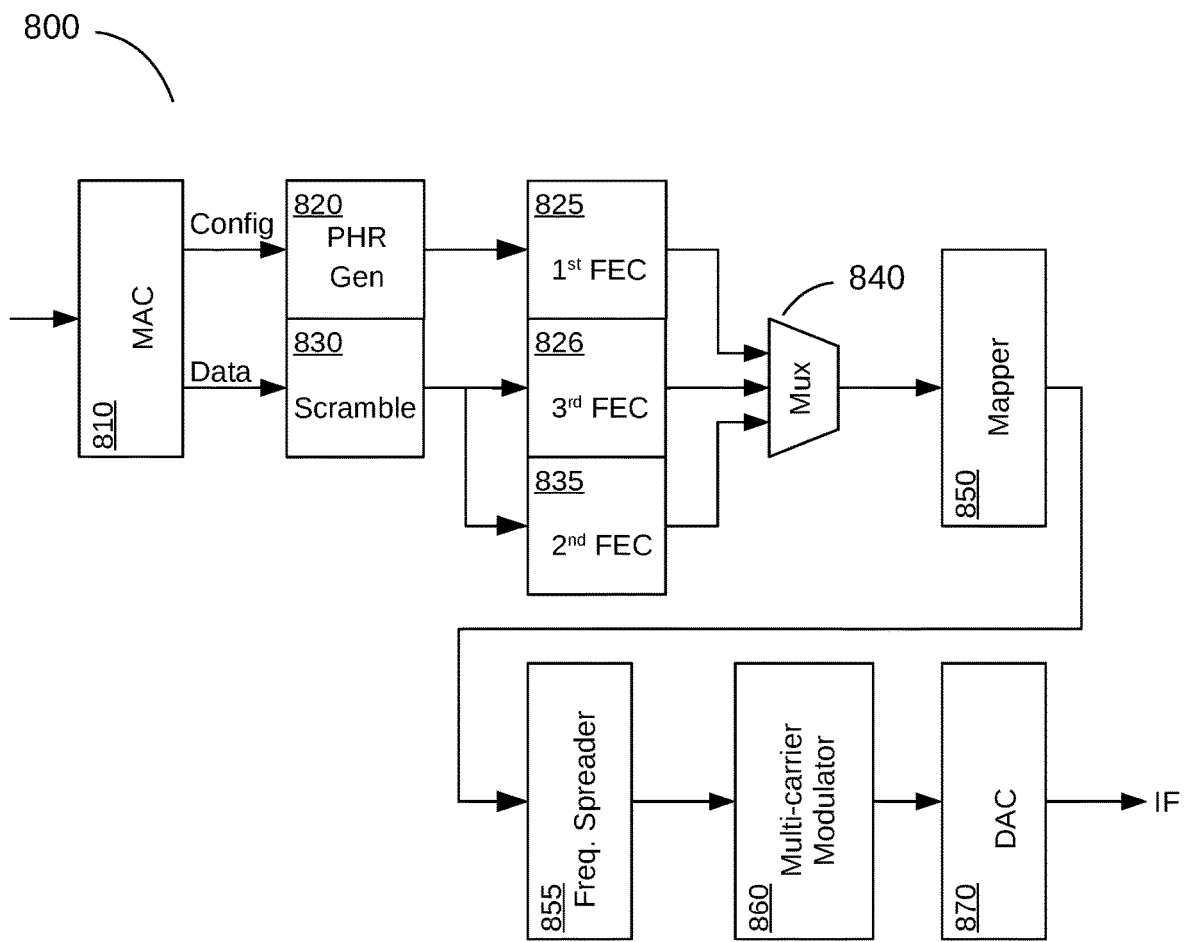
FIG. 8 illustrates a digital radio modulator according to an embodiment of the invention.

FIG. 8 illustrates a digital radio modulator 800 according to an embodiment of the invention. Digital radio modulator 800 may receive its data via MAC 810 (MAC=medium access control), wherein the function of a MAC layer may be defined by the Open Systems Interconnection (OSI) model. MAC 810 provides configuration information, including MCS information, to PHR generator 820, which provides a generated PHR to first FEC 825. First FEC 825 may perform, for example, convolutional encoding. MAC 810 provides payload data to scrambler 830, which directly provides scrambled payload data to second FEC 835 and to third FEC 826. Third FEC 826 may also perform convolutional encoding, to provide backward compatibility with, for example, the IEEE 802.15.4g standard, by allowing both the generated PHR and scrambled payload information to use the same encoding scheme. However, second FEC 835 provides encoding according to an encoding scheme different than those of first FEC 825 and third FEC 826, and with a higher coding efficiency. Second FEC 835 may, for example, comprise a BCH-LDPC encoder. This allows the embodiment to transmit data more efficiently. A multiplexer 840 receives the output signals from first FEC 825, second FEC 835, and third FEC 826, and determines when and which of their error coded output signals is forwarded to subsequent blocks. A mapper 850 maps the forwarded error coded data onto modulation constellation points, such as BPSK, QPSK, QAM, M-QAM, or APSK constellation points. Mapper 850 may provide the constellation points to frequency spreader 855, which takes the constellation points and assigns each of them to one or more subcarriers in the frequency domain (as defined by the applicable MCS) to provide frequency diversity and make the communication signal less prone to frequency-bound interference, and to decrease the peak-to-average-power (PAPR) ratio. The frequency spreader creates multiple copies of the mapped and encoded physical header data bits, such that the multiple copies provide enough frequency diversity to allow a remote receiver to receive the encoded physical header data with a higher signal-to-noise ratio than the encoded payload data. The frequency-spread signal is modulated onto the assigned multiple simultaneous subcarriers and converted from the frequency domain to the time domain by multi-carrier modulator 860, which may for example be an OFDM modulator, such as a processor performing an inverse fast Fourier transformation (IFFT), an inverse discrete cosine transform (IDCT), or yet another transformation. A DAC 870 (digital-to-analog converter) converts the modulated subcarriers output by multi-carrier modulator 860 to an analog signal, which may be at an intermediate frequency (IF).

FIG. 8 provides a simplified block diagram of the modulator part, leaving out functions that are not essential to the invention, but that would normally be included in a digital radio system. A person with ordinary skills in the art would know that such functions may include data punctuation, time interleaving, frequency interleaving, framing, insertion of pilot, guard and zero carriers, insertion of the SHR and a cyclic prefix, and other functions commonly seen in IEEE 802.15.4g and other standards and systems for digital radio. He or she would also know that data delivered by MAC 810 is grouped in units to be transmitted as symbols that are handled in the frequency domain through frequency spreader 855, and converted to the time domain by multi-carrier modulator 860. DAC 870 takes the digital data in the time domain and converts it to an analog signal suitable for further analog processing, such as in first RF stage 116 of FIG. 1.

Figure 9:
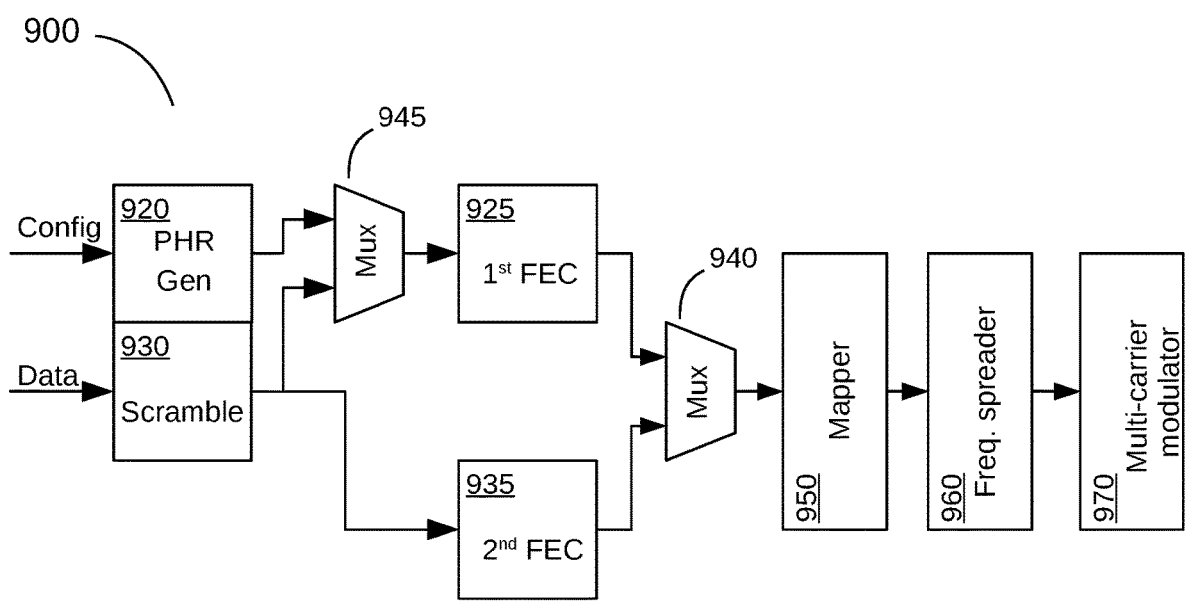
FIG. 9 illustrates details of an alternative embodiment of a digital radio modulator.

FIG. 9 illustrates details 900 of an alternative embodiment of a digital radio modulator. The details include PHR generator 920, scrambler 930, multiplexer 945, first FEC 925, second FEC 935, multiplexer 940, mapper 950, frequency spreader 960, and multi-carrier modulator 970. Since in FIG. 8 the first FEC 825 and the third FEC 826 perform the same type of encoding, a single block preceded by a multiplexer could perform the function of both. The embodiment of FIG. 9 capitalizes on this by using first FEC 925 and multiplexer 945 to provide functionality that is backward compatible to, for example, IEEE 802.15.4g. In a "backward-compatible" mode, the embodiment uses only first FEC 925, whereas in an "efficient" mode, scrambled payload data from scrambler 930 is encoded by second FEC 935. Thus, the state of multiplexer 945 determines whether the digital radio modulator is in a backward-compatible mode or in an efficient mode. Multiplexer 940 works complementary to multiplexer 945 to provide the encoded data to mapper 950. That is, in backward-compatible mode, multiplexer 945 passes either PHR data from PHR generator 920 or scrambled payload data from scrambler 930 to first FEC 925, and multiplexer 940 always passes data from first FEC 925 to mapper 950. However, in efficient mode, multiplexer 945 only passes the PHR from PHR generator 920 to first FEC 925, and multiplexer 940 alternatively passes the error-coded PHR from first FEC 925 to mapper 950, or error-coded payload data from second FEC 935. Frequency spreader 960 provides frequency diversity by embedding multiple copies of PHR bits or payload data bits per symbol. The frequency diversity boosts the signal-to-noise ratio with which the PHR and payload can be received. Embodiments of the invention may use a different frequency diversity for the PHR than for the payload, to ensure that the robustness of the PHR transmission is higher than for the payload, even though the error coding system (e.g. BCH-LDPC) for the payload may be more robust than the error coding system (e.g. convolutional encoding) for the PHR. Additionally, embodiments that focus on a high data rate at low power rather than a large transmission range at low power may use mapping constellations that are not available in IEEE 802.15.4g, including 64-QAM, 256-QAM, and APSK.

Figure 10:
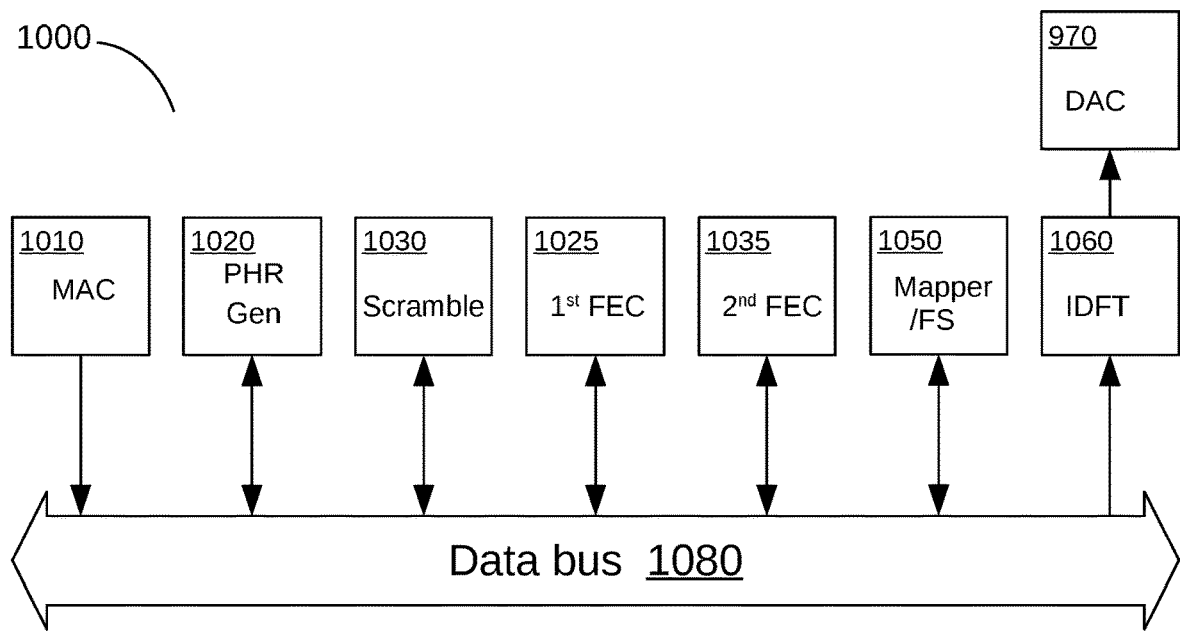
FIG. 10 illustrates details of another alternative architecture of a digital radio modulator according to an embodiment of the invention.

FIG. 10 illustrates another alternative architecture 1000 of a digital radio modulator according to an embodiment of the invention. Its functionality is identical to the digital radio modulators of FIG. 8 and FIG. 9. Therefore MAC 1010, PHR generator 1020, scrambler 1030, first FEC 1025, second FEC 1035, mapper and frequency spreader 1050, multi-carrier modulator 1060, and DAC 1070 all have the same functionality as like numbered blocks in FIGS. 8 and 9. However, the data flow between the successive blocks is via data bus 1080, and may be controlled by firmware. Availability of data bus 1080 makes the use of multiplexers (840, 940, 945) unnecessary.

Figure 11:
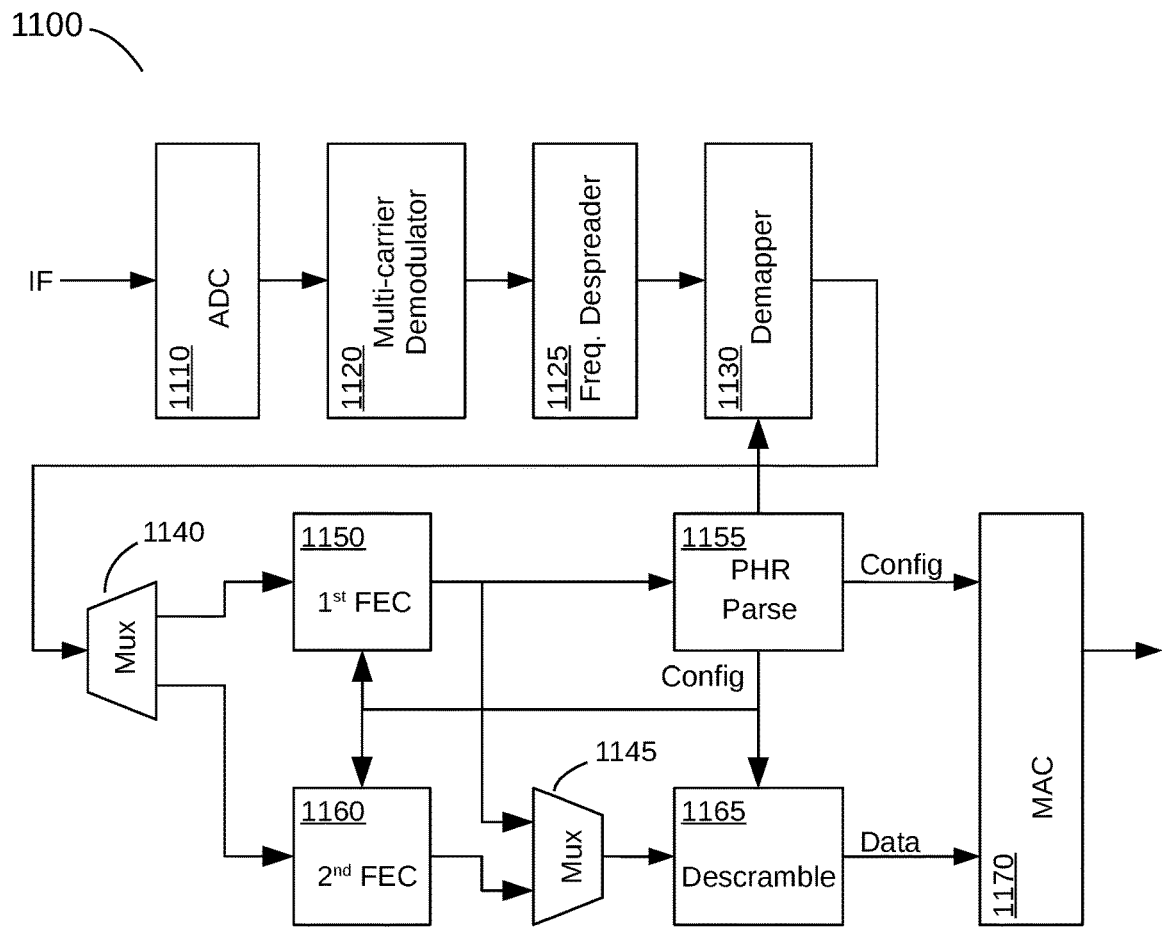
FIG. 11 illustrates a digital radio demodulator according to an embodiment of the invention.

FIG. 11 illustrates a digital radio demodulator 1100 according to an embodiment of the invention. Digital radio demodulator 1100 comprises ADC 1110 (analog-to-digital converter), demodulator 1120, which may demodulate multiple simultaneous subcarriers, frequency despreader 1125, demapper 1130, multiplexer 1140, first FEC decoder 1150, second FEC decoder 1160, multiplexer 1145, PHR parser 1155, descrambler 1165, and, optionally, MAC 1170. ADC 1110 takes an analog signal, for example an IF signal or zero-IF signal, and converts it to the digital domain. Demodulator 1120 demodulates the converted signal and outputs a (first) series of constellation points with which the subcarriers have been modulated. Demodulator 1120 takes a received signal from the time domain to the frequency domain. To do so, demodulator 1120 must be aware of the frequency or frequencies and phase or phases of the subcarriers. Synchronization circuitry to provide this information to demodulator 1120 is well-known in the art and has not been drawn. Demodulator 1120 may, in some embodiments, comprise an OFDM demodulator performing a fast Fourier transform (FFT), discrete cosine transform (DCT), or any other transformation to convert a series of samples representing successive values in the time domain to the first series of constellation points, representing successive carriers in the frequency domain. If the modulated information has been repeated (to provide frequency diversity) over multiple subcarriers to make the modulation signal less prone to frequency-bound interference and to decrease the peak-to-average power ratio (PAPR), then frequency despreader 1125 de-spreads the information by reducing the first series of constellation points to a smaller second series of constellation points, where the constellation points from the second series have a higher average signal-to-noise ratio than constellation points from the first series. One novel technique to provide frequency despreading is described with reference to FIG. 14, and further techniques are known in the art. In an embodiment, frequency despreader 1125 selects and combines multiple constellation points to calculate a single constellation point with higher signal-to-noise ratio (SNR). In another embodiment, despreading uses multiple independent copies of a data item mapped into the constellation points to obtain a single copy of the data item with improved bit-error-rate (BER). Each of the copies may itself have a reduced SNR or BER due to transmission and reception errors such as noise, interference, fading, and echoes in the transmission channel and/or receiver. By combining multiple copies or the information of multiple copies, an embodiment can select a copy with the best estimated signal-to-noise ratio (SNR) or reconstruct a copy with a SNR that is better than the best estimated or the average SNR, and that therefore results in an improved BER. Demapper 1130 takes the reconstructed constellation points from frequency despreader 1125, and decodes the constellation points to demapped data. In embodiments, demapper 1130 may be or include a "soft demapper", i.e. a demapper that provides bits characterizing robustness of the received data, also known as "soft bits", for example LLR bits, ( ) for use by second FEC decoder 1160. The demapped data from demapper 1130 is split by multiplexer 1140, which separates PHR and payload data if digital radio demodulator 1100 is in "efficient" mode, or which passes both the PHR and the payload data to first FEC decoder 1150 in "backward compatible" mode. First FEC decoder 1150 detects and corrects errors in the header data, and forwards the error-corrected header data to PHR parser 1155, which finds the configuration data in the PHR. In "backward-compatible" mode, first FEC decoder 1150 also detects and corrects errors in payload data. However, in "efficient" mode, multiplexer 1140 passes payload data to second FEC decoder 1160 for more efficient detection and correction of errors. Multiplexer 1145 retrieves error-corrected payload data from either first FEC decoder 1150 (backward-compatible mode) or second FEC decoder 1160 (efficient mode), and forwards it to descrambler 1165. Descrambler 1165 forwards the descrambled payload to MAC 1170. PHR parser 1155 finds configuration data in the error-corrected PHR and forwards the configuration data to demapper 1130, first FEC decoder 1150 (backward-compatible mode), second FEC decoder 1160 (efficient mode), descrambler 1165, and MAC 1170.

First FEC decoder 1150 detects and corrects errors according to a first error correction and detection method. In some embodiments, data may be encoded with convolutional encoding, and the first FEC decoder 1150 may be a Viterbi decoder. Second FEC decoder 1160 detects and corrects errors according to a second error correction and detection method. In some embodiments, data may be encoded with BCH and LDPC encoding, and second FEC decoder 1160 may include a BCH decoder and an LDPC decoder. Second FEC decoder 1160 may use soft bits and a minimum-sum algorithm for LDPC decoding. Demodulation and the minimum-sum algorithm may use settings such as have been described with reference to FIG. 7.

Although FIG. 11 illustrates digital radio demodulator 1100 in an architecture similar to the digital radio modulator whose details are shown in FIG. 9, other architectures are equally viable and within the ambit and scope of this invention. For example, a digital radio demodulator in the same fashion as digital radio modulator 800 with three independent FEC (decoders) will function equally well. Similarly, a digital radio demodulator in the same fashion as alternative architecture 1000 in FIG. 10, where successive blocks interchange data via a data bus, will function equally well. Further, embodiments of a digital radio modulator or demodulator may or may not include a MAC. Embodiments of a digital radio modulator without a MAC may feature payload and configuration data inputs instead. Embodiments of a digital radio demodulator without a MAC may feature payload and configuration data outputs instead. Functionality of several blocks may be combined and performed by a single digital signal processing block that may be directed by firmware.

Figure 12:
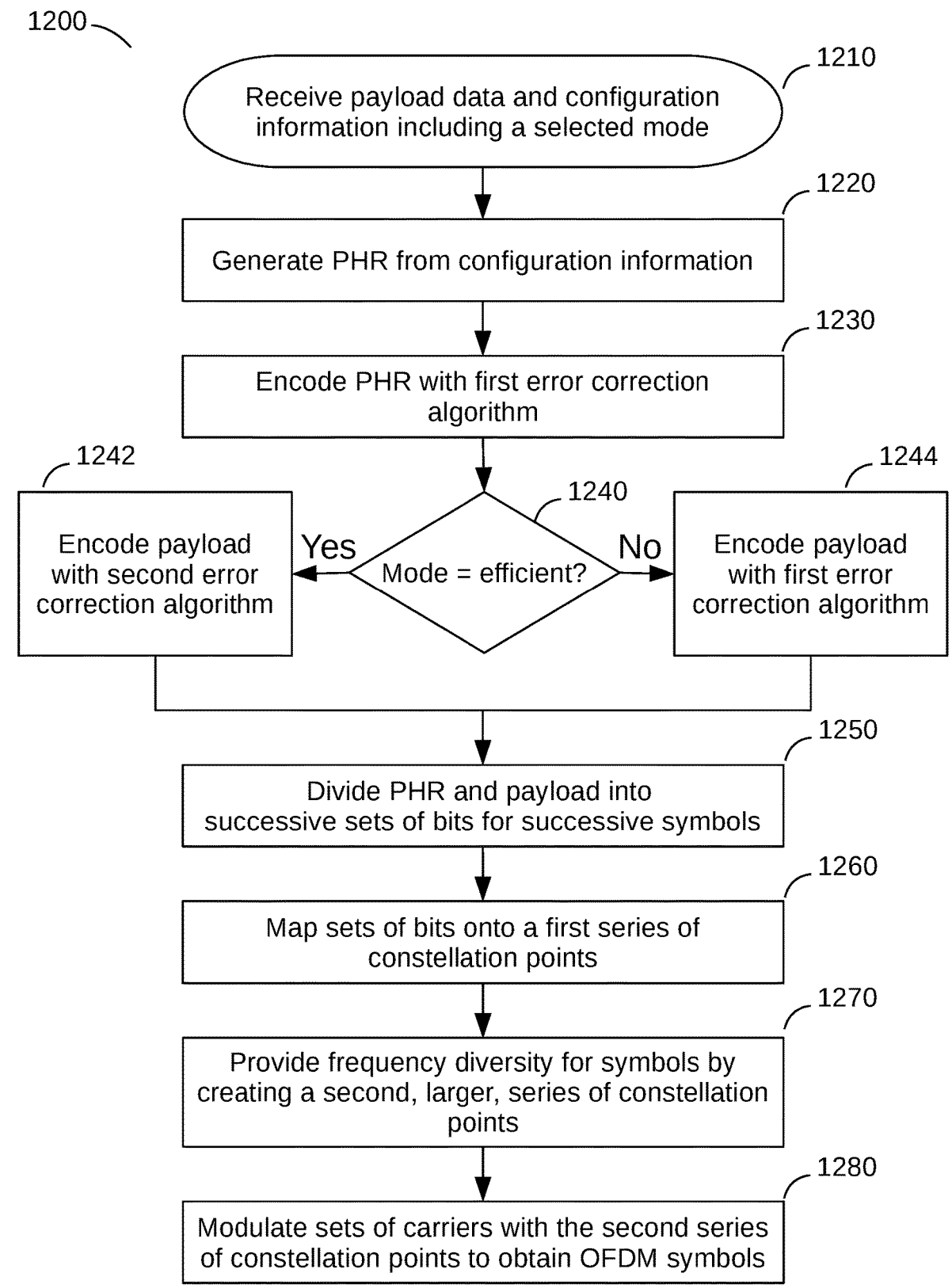
FIG. 12 illustrates a method of modulating payload information with selectable backward compatibility according to an embodiment of the invention.

FIG. 12 illustrates a method 1200 of modulating payload information with selectable backward compatibility according to an embodiment of the invention. Method 1200 includes the following steps.

Step 1210—receiving payload data and configuration information. The configuration information includes data identifying a mode selection, for example "efficient" or "backward compatible", and may further include parameters for forward error coding, scrambling, mapping, frequency diversity, and other settings and information.

Step 1220—generating a physical header (PHR) using the configuration information. The PHR may be based on an existing standard such as IEEE 802.15.4g, and it may add information related to the "efficient" mode, while maintaining backward compatibility with the existing standard where feasible. Step 1220 may be performed, for example, by PHR generator 820 in FIG. 8, PHR generator 920 in FIG. 9, or PHR generator 1020 in FIG. 10.

Step 1230—encoding the PHR with a first error coding algorithm, for example convolutional encoding. The encoding uses the most robust configuration parameters available. Step 1230 may be performed, for example, by first FEC 825 in FIG. 8, first FEC 925 in FIG. 9, or first FEC 1025 in FIG. 10. The first error coding algorithm has a first coding efficiency.

Step 1240—determining if the mode is "efficient", based on the identified mode selection. Step 1240 may be performed, for example, by inspecting configuration data presented to PHR generator 820 in FIG. 8, PHR generator 920 in FIG. 9, or PHR generator 1020 in FIG. 10.

Step 1242—upon determining that the mode is "efficient", encoding the payload information with a second error coding algorithm, for example BCH followed by LDPC. The second error coding algorithm has a second coding efficiency, which is higher than the first coding efficiency. Encoding with the second error coding algorithm uses parameters included in the configuration information. Settings may conform to those shown in FIG. 7 for encoding. Step 1242 may be performed, for example, by second FEC 835 in FIG. 8, second FEC 935 in FIG. 9, or second FEC 1035 in FIG. 10.

Step 1244—upon determining that the mode is not "efficient", encoding the payload information with the first error coding algorithm. The encoding may use parameters included in the configuration information. In embodiments, the encoding may include or be convolutional encoding. Step 1244 may be performed, for example, by third FEC 826 in FIG. 8, first FEC 925 in FIG. 9, or first FEC 1025 in FIG. 10.

Step 1250—dividing the data included in the PHR over a first number of successive symbols and the data included in the payload over a second number of successive symbols.

Step 1260—mapping the data in each of the first number and second number of successive symbols into a first series of constellation points. Data is mapped according to a mapping configuration. A first mapping configuration applies to constellation points carrying PHR information, and is the available mapping that is most robust against transmission error. A second mapping configuration applies to constellation points carrying payload information. Step 1260 may be performed, for example, by mapper 850 in FIG. 9, mapper 950 in FIG. 9, or mapper and frequency spreader 1050 in FIG. 10.

Step 1270—providing frequency diversity within the successive symbols by repeating constellation points related to the PHR a first number of times, and constellation points related to the payload a second number of times. This creates a second series of constellation points, including both the original and the repeated constellation points. Step 1270 may be performed, for example, by frequency spreader 855 in FIG. 8, frequency spreader 960 in FIG. 9, or mapper and frequency spreader 1050 in FIG. 10.

Step 1280—modulating the successive symbols onto successive sets of carriers by, for each symbol, modulating an amplitude and a phase of each carrier in the set of carriers according to an amplitude and a phase of a corresponding constellation point in the second series of constellation points. Step 1280 may be performed, for example, by multi-carrier modulator 860 in FIG. 8, multi-carrier modulator 970 in FIG. 9, or multi-carrier modulator 1060 in FIG. 10.

Figure 13:
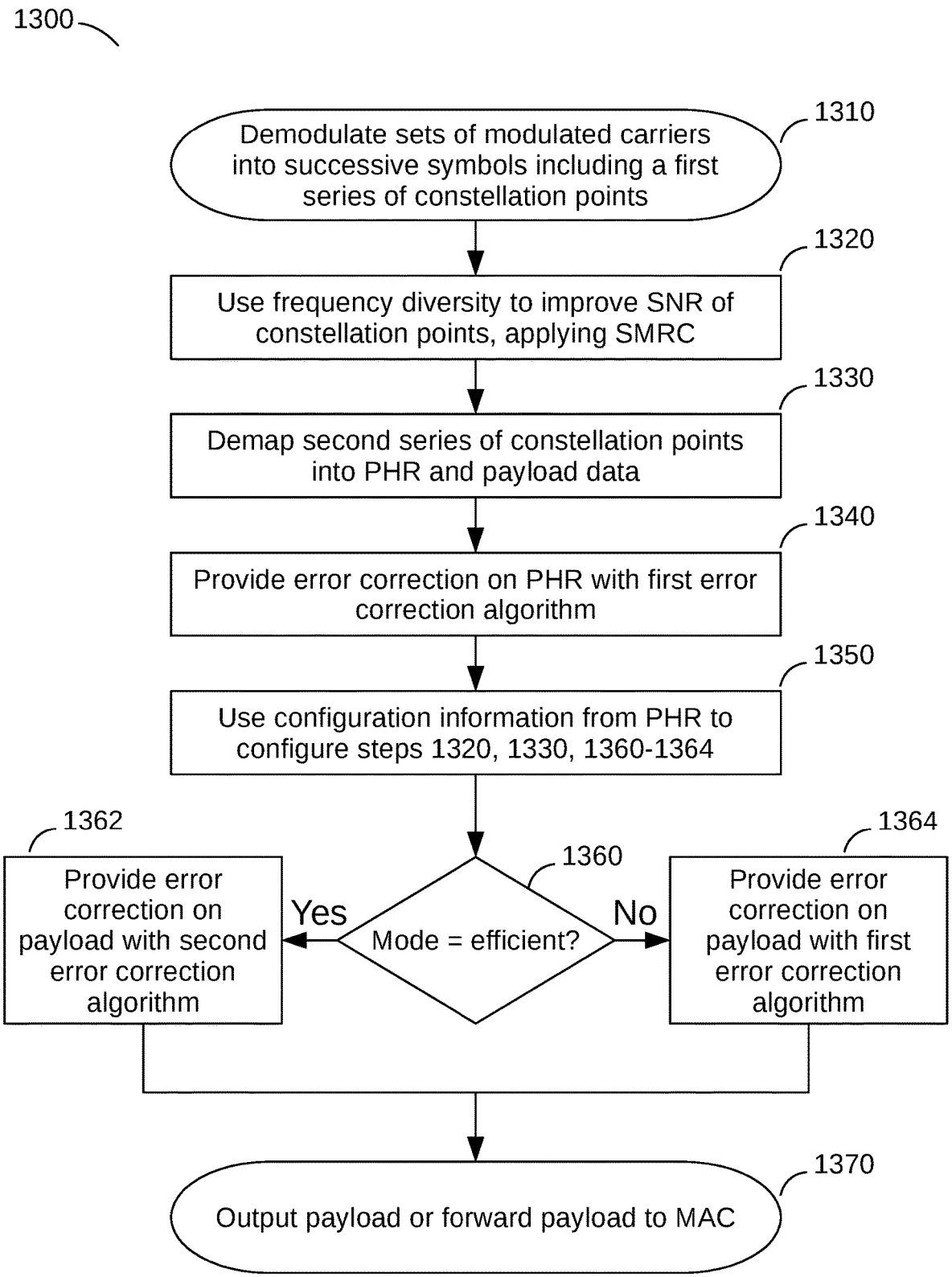
FIG. 13 illustrates a method of demodulating payload information with selectable backward compatibility according to an embodiment of the invention.

FIG. 13 illustrates a method 1300 of demodulating payload information with selectable backward compatibility according to an embodiment of the invention. Method 1300 comprises the following steps.

Step 1310—demodulating successive sets of modulated carriers into successive symbols, each including a first series of constellation points associated with the modulated carriers. A constellation point is defined by a carrier's amplitude and phase, as is common practice in the art, and is associated with one or more bits of data dependent on a mapping configuration. Step 1310 may be performed, for example, by demodulator 1120 in FIG. 11.

Step 1320—using frequency diversity to improve the SNR of constellation points. An embodiment creates a second series of constellation points by selecting and/or combining constellation points in the first series of constellation points. Therefore, the second series of constellation points is smaller than the first series of constellation points. The average signal-to-noise ratio (SNR) of the second series of constellation points is higher than the average SNR of the first series of constellation points. Some embodiments of the invention may apply one of the following frequency despreading techniques to improve the SNR of constellation points. Step 1320 may be performed, for example, by frequency despreader 1125 in FIG. 11.

Frequency despreading techniques including selection combining, diversity combining, maximal ratio combining, selection maximum ratio combining, or any combination of these techniques. All methods rely on having multiple independent copies of the original data item (PHR or payload). The multiple copies may come from having multiple copies in the transmitted signal, or they may come from multiple signals received from different antennas. The simplest technique, selection combining, inspects all copies, and selects the copy with the highest estimated SNR, or the one with the largest signal. All other copies are ignored. This method has the lowest performance, and it is sometimes improved by taking the average of several copies in the top-2, or top-4, etc.

In diversity combining, several or all copies are weighted and linearly combined. Fading in the different copies is assumed to be uncorrelated and following a Gaussian distribution. The overall performance improves the more copies there are available.

Another technique is called maximal ratio combining. It provides the best performance, but has the highest complexity. The technique relies on knowledge of each copy's channel conditions (fading amplitude and phase). To maximize the resulting SNR, it performs amplitude and phase correction on each of the copies and combines them by taking the average.

Some embodiments of the invention use a new technique called selection maximal ratio combining (SMRC). SMRC selects, out of M total copies, the copies with the L strongest signals according to a selection combining criterion, then weighs the selected copies, phase corrects them, and sums them. Details of this technique are given with reference to FIG. 14.

Step 1330—demapping the second series of constellation points into PHR and payload data, based on a first and a second mapping configuration. The first mapping configuration applies to constellation points carrying PHR information, and is the available mapping configuration that is most robust against transmission error. The second mapping configuration applies to constellation points carrying payload information. Step 1330 may be performed, for example, by demapper 1130 in FIG. 11.

Step 1340—performing error detection and correction on the PHR data using a first error detection and correction algorithm, where parameters for the first error detection and correction algorithm are the available parameters that are most robust against transmission error. The first error detection and correction algorithm may be or include Viterbi decoding. Step 1340 may be performed, for example, by first FEC decoder 1150 in FIG. 11.

Step 1350—parsing the PHR to obtain configuration information, and using the configuration information for Step 1320, Step 1330, Step 1360, Step 1362, and/or Step 1364. Configuration information for Step 1362 includes LDPC configuration settings as shown in FIG. 7. Step 1350 may be performed, for example, by PHR parser 1155 in FIG. 11.

Step 1360—determining if a mode is "efficient". An embodiment determines from the configuration information if it includes a configuration option that is only available in "efficient" mode. If so, then the mode is "efficient", else the mode is "backward-compatible".

Step 1362—upon determining that the mode is "efficient", performing error detection and correction on the payload data using a second error detection and correction algorithm, where parameters for the second error detection and correction algorithm are provided by Step 1350. The second error detection and correction algorithm may be or include BCH and LDPC. Parameters for the LDPC algorithm are shown in FIG. 7. Step 1362 may be performed, for example, by second FEC decoder 1160 in FIG. 11.

Step 1364—upon determining that the mode is not "efficient", performing error detection and correction on the payload data using the first error detection and correction algorithm, where parameters for the first error detection and correction algorithm are provided by Step 1350. Step 1364 may be performed, for example, by first FEC decoder 1150 in FIG. 11.

Step 1370—outputting the error-corrected payload data and/or forwarding the error-corrected payload data to a MAC.

Figure 14:
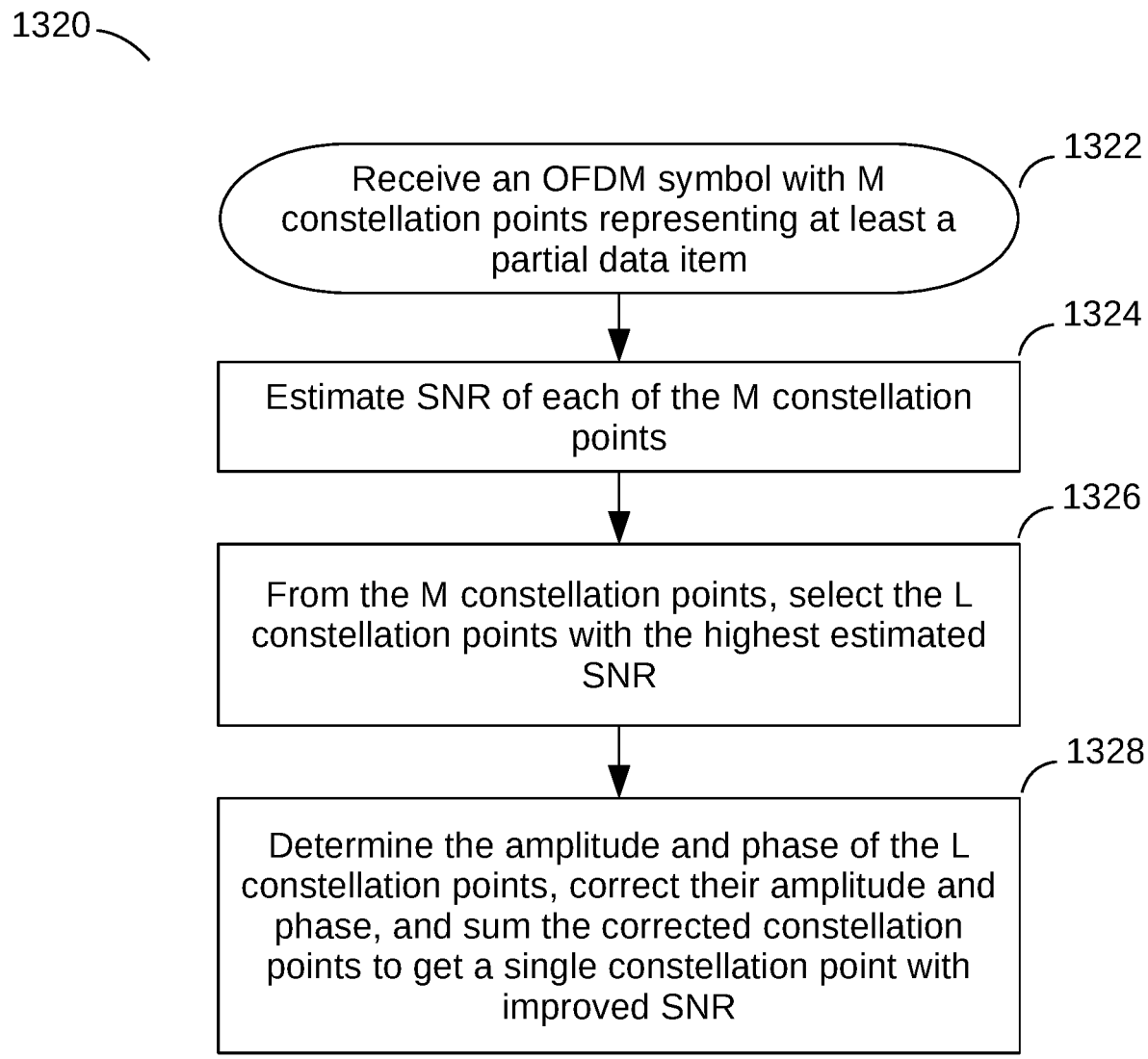
FIG. 14 illustrates further detail of the method of FIG. 13 according to an embodiment of the invention.

FIG. 14 illustrates further detail 1320 of the method of FIG. 13 according to an embodiment of the invention. More specifically, FIG. 14 provides details of despreading using SMRC. SMRC includes the following steps.

Step 1322—receiving a series of OFDM symbols with M data subcarriers represented by M constellation points, each representing at least a part of a data item. The part of the data item may be as small as a single bit. A single OFDM symbol may include the M constellation points, which enables despreading on a per-symbol basis. Despreading uses constellation points of data subcarriers in the OFDM symbol, and may ignore pilot, DC, and null subcarriers. In an example, a forward-error-encoded PHR (a data item) may include 72 bits (as in Annex L of the IEEE 802.15.4g-2012 standard). The PHR may be included in a transmission as 4 independent copies (M=4), so a total 288 bits, which could be mapped over 6 successive OFDM symbols. Thus, each OFDM symbol includes 48 modulated subcarriers that together represent 12 bits of the forward-error-encoded PHR. The modulation may, for example, be binary phase shift keying (BPSK), which provides 1 bit per subcarrier. Thus, a BPSK constellation point represents one bit of the data item, whereas a QPSK constellation point represents two bits of the data item. (In general, embodiments may receive series of OFDM symbols of any length, including any number M of copies of a data item.)

Step 1324—estimating a SNR of each of the M constellation points. In the above example, Step 1324 estimates the SNR of each of 48 modulated subcarriers in an OFDM symbol, representing four (M=4) copies of 12 at least partial data items. Many ways of estimating SNR are known in the art. One low-cost method is to use a subcarrier's amplitude as a proxy (estimate) for its SNR. Another, more advanced, method uses a value obtained from an OFDM receiver's equalizer, which may estimate the subcarrier's relative strength based on interpolation using nearby pilot subcarriers. In this method, the more the equalizer must amplify a subcarrier, the lower is the subcarrier's estimated SNR.

Step 1326—for each M constellation points that relate to the partial data item, selecting the L constellation points with the highest estimated SNR. For example, while the embodiment receives 4 independent copies, it may disregard the worst modulated subcarrier out of each 4 constellation points related to one bit of the PHR, leaving the best 3 modulated subcarriers related to the bit (L=3). This is repeated for each of the 72 bits of the forward-error-encoded PHR.

Step 1328—for the partial data item, determining the amplitude and phase of the L selected modulated subcarriers, correcting the amplitude and phase of the L selected modulated subcarriers, and summing the selected modulated subcarriers to obtain a modulated subcarrier with improved SNR. In the example, for each of the 72 bits, the embodiment corrects the amplitude and phase of each of the three selected modulated subcarriers (e.g., in an equalizer), and then sums the three corrected modulated subcarriers to obtain a modulated subcarrier with improved SNR.

Although the description has been described with respect to particular embodiments thereof, these particular embodiments are merely illustrative, and not restrictive. For example, the demodulator in FIG. 11 has an architecture similar to the modulator of FIG. 9. However, a demodulator with a bus structure to move data between successive blocks, similar to the modulator in FIG. 10, may perform the same method as the demodulator in FIG. 11. All modulators and demodulators shown in FIGS. 8-10 can perform in a backward-compatible mode, as well as in a high-efficiency mode. Further, although example modulators and demodulators in the figures perform forward or reverse FFT or DCT transforms, other transforms such as discrete wavelet transform, Walsh Hadamard transform, and any other transform used in the art are equally well within the scope of the invention.

Any suitable logic technology can be used to implement the circuits of particular embodiments including CMOS, NMOS, PMOS, BiCMOS, bipolar, hetero junction bipolar (BJT), FinFET, nanowire, carbon-nanotube FET, etc. The invention may be implemented in dedicated circuits fabricated in a semiconductor material, or as temporary circuits programmed in a field-programmable gate array (FPGA). Particular embodiments may be implemented by using programmable logic devices, optical, chemical, biological, quantum or nanoengineered systems, etc. Other components and mechanisms may be used. In general, the functions of particular embodiments can be achieved by any means as known in the art.

It will also be appreciated that one or more of the elements depicted in the drawings/figures can also be implemented in a more separated or integrated manner, or even removed or rendered as inoperable in certain cases, as is useful in accordance with a particular application.

As used herein, the term "and/or" should be interpreted to mean one or more items. For example, the phrase "A, B, and/or C" should be interpreted to mean any of: only A, only B, only C, A and B (but not C), B and C (but not A), A and C (but not B), or all of A, B, and C. As used herein, the phrase "at least one of" should be interpreted to mean one or more items. For example, the phrase "at least one of A, B, and C" or the phrase "at least one of A, B, or C" should be interpreted to mean any of: only A, only B, only C, A and B (but not C), B and C (but not A), A and C (but not B), or all of A, B, and C. As used herein, the phrase "one or more of" should be interpreted to mean one or more items. For example, the phrase "one or more of A, B, and C" or the phrase "one or more of A, B, or C" should be interpreted to mean any of: only A, only B, only C, A and B (but not C), B and C (but not A), A and C (but not B), or all of A, B, and C.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

The invention claimed is:

1. A digital radio modulator, comprising:
   a physical header generator configured to generate a physical header that includes configuration information;
   a first forward error encoder, configured to receive and encode the physical header using a first forward error encoding method with a first coding efficiency;
   a second forward error encoder, configured to receive and encode payload data using a second forward error encoding method with a second coding efficiency;
   wherein:
   (i) the second forward error encoding method is different than the first forward error encoding method;
   (ii) the second coding efficiency is higher than the first coding efficiency;
   (iii) the second forward error encoding method includes Bose-Chaudhuri-Hocquenghem (BCH) and low-density parity coding (LDPC) encoding; and
   (iv) the second forward error encoding method uses an effective code rate of 4 over 9;

a mapper configured to receive encoded physical header data from the first forward error encoder and encoded payload data from the second forward error encoder, and configured to map the encoded physical header data and the encoded payload data to a first series of constellation points;

a frequency spreader configured to create copies of at least part of the first series of constellation points, wherein the first series of constellation points and the copies constitute a second series of constellation points that provides enough frequency diversity to allow a remote receiver to receive the encoded physical header data with a higher signal-to-noise ratio than the encoded payload data; and a multi-carrier modulator, configured to receive the second series of constellation points from the frequency spreader, and configured to modulate a series of subcarriers with the second series of constellation points.

2. The digital radio modulator of claim 1, wherein the multi-carrier modulator uses orthogonal frequency-division multiplexing (OFDM) to modulate the series of subcarriers with the second series of constellation points.

3. The digital radio modulator of claim 1, wherein the first forward error encoding method includes convolution encoding.

4. The digital radio modulator of claim 1, further comprising a first multiplexer and a second multiplexer, wherein the first multiplexer is configured to select between physical header data and payload data and to forward the selected data to the first forward error encoder, and wherein the second multiplexer is configured to select between encoded data from the first forward error corrector and encoded data from the second forward error corrector and to forward the selected encoded data to the mapper.

5. The digital radio modulator of claim 1, wherein the physical header generator, the first forward error corrector, the second forward error corrector, and the mapper exchange data via a data bus.

6. A digital radio demodulator, comprising:
a multi-carrier demodulator configured to:
receive a series of subcarriers modulated with a first series of constellation points;
demodulate the series of subcarriers to obtain the first series of constellation points; and
forward the first series of constellation points to a frequency despreader configured to select and combine multiple constellation points of the first series of constellation points to obtain a second series of constellation points, smaller than the first series, and wherein constellation points from the second series have a higher average signal-to-noise ratio than constellation points from the first series;
a soft demapper configured to receive the second series of constellation points and to convert these to first encoded data, second encoded data, and bits carrying a log-likelihood ratio (LLR) characterizing robustness of the second encoded data, wherein the number of LLR bits is between 3 and 8, inclusive;
a first forward error decoder configured to receive first encoded data and to detect and correct errors in the first encoded data to obtain first error-corrected data;
a second forward error decoder configured to receive the LLR bits including at least a part of the second encoded data, and to detect and correct errors in the second encoded data to obtain second error-corrected data, wherein the second forward error decoder includes a Bose-Chaudhuri-Hocquenghem (BCH) decoder and a low-density parity coding (LDPC) decoder executing a minimum-sum LDPC algorithm that uses an effective code rate of 4 over 9, a normalization factor between 1 and 6 inclusive, and up to 50 iterations;

a physical header parser configured to find configuration data in the first error-corrected data, wherein the digital radio demodulator is configured to determine the number of LDPC iterations and/or the LDPC normalization factor based on the configuration data; and a payload data output configured to output a part of first error-corrected data when in a backward-compatible mode and to output second error-corrected data when in a high-efficiency mode.

7. A method for demodulating digital data, comprising:
demodulating a set of modulated carriers into a symbol that includes a first series of constellation points associated with the modulated carriers;
using frequency diversity to obtain a second series of constellation points, smaller than the first series of constellation points, and with improved signal-to-noise ratios;
demapping a first part of the second series of constellation points into error-encoded physical header (PHR) data based on a first mapping configuration;
using a first error detection and correction algorithm to perform error detection and correction on the error-encoded PHR data to obtain error-corrected PHR data, where parameters for the first error detection and correction algorithm are predetermined parameters that provide a first robustness against transmission errors;
parsing the error-corrected PHR data to obtain configuration information;
determining from the configuration information if a mode is "efficient" by determining if the configuration information includes a configuration option that is only available in "efficient" mode;
upon determining that the mode is "efficient", obtaining a second mapping configuration and second error-detection and correction parameters based on the configuration information;
upon determining that the mode is "efficient", using the second mapping configuration for demapping a second part of the second series of constellation points into error-encoded payload data, and to calculate bits carrying a log-likelihood ratio (LLR) characterizing robustness of the error-encoded payload data, wherein the number of LLR bits is between 3 and 8, inclusive;
upon determining that the mode is "efficient", performing error detection and correction on the error-encoded payload data to obtain error-corrected payload data, using a second error detection and correction algorithm that includes a minimum-sum low-density parity code (LDPC) algorithm, using at least a part of the second error-detection and correction parameters;
upon determining that the mode is not "efficient", performing error detection and correction on the error-coded payload data using the first error detection and correction algorithm to obtain the error-corrected payload data, using parameters for the first error detection and correction algorithm included in the configuration information; and
outputting the error-corrected payload data.

8. The method of claim 7, wherein the first error detection and correction algorithm includes Viterbi decoding.

9. The method of claim 7, wherein the second error detection and correction algorithm further includes Bose-Chaudhuri-Hocquenghem (BCH) decoding.

10. The method of claim 7, wherein the second mapping configuration includes an effective code rate of 4 over 9, and wherein the second error-detection and correction parameters include a normalization factor between 1 and 6 inclusive, and a number of iterations up to 50.

11. The method of claim 7, further comprising:
- receiving the first series of constellation points, wherein the first series of constellation points includes M constellation points that represent at least part of a data item;
- estimating a signal-to-noise ratio (SNR) of each of the M constellation points;
- from the M constellation points, selecting L constellation points with the highest estimated SNR, wherein L is lower than or equal to M; and
- determining an amplitude and phase of each of the L selected constellation points, correcting the amplitude and phase of each of the L selected constellation points, and summing the L selected and corrected constellation points to obtain a single constellation point with improved SNR, wherein the single constellation point represents the at least part of the data item with a higher bit error ratio than average.

* * * * *